United States Patent
Tsuzuki et al.

(10) Patent No.: US 8,455,958 B2
(45) Date of Patent: Jun. 4, 2013

(54) INSULATED GATE SEMICONDUCTOR DEVICE WITH WELL REGION EDGE POSITIONED WITHIN RING-SHAPED BUFFER TRENCH

(75) Inventors: Yukio Tsuzuki, Nukata-gun (JP); Kenji Kouno, Gifu (JP)

(73) Assignee: DENSO CORPORATION, Kariya (JP)

( * ) Notice: Subject to any disclaimer, the term of this patent is extended or adjusted under 35 U.S.C. 154(b) by 244 days.

(21) Appl. No.: 13/090,288

(22) Filed: Apr. 20, 2011

(65) Prior Publication Data
US 2011/0260212 A1 Oct. 27, 2011

(30) Foreign Application Priority Data

Apr. 22, 2010 (JP) .................................. 2010-98752
Nov. 23, 2010 (JP) ................................ 2010-260700

(51) Int. Cl.
*H01L 27/088* (2006.01)
(52) U.S. Cl.
USPC ............ 257/401; 257/330; 257/139; 257/339
(58) Field of Classification Search
CPC ............ H01L 29/66333; H01L 29/6634; H01L 29/66348
USPC .................. 257/330, 139, 339, 401
See application file for complete search history.

(56) References Cited

U.S. PATENT DOCUMENTS

| 5,525,821 | A | * | 6/1996 | Harada et al. ................. 257/331 |
| 5,585,651 | A | * | 12/1996 | Kitagawa et al. ............. 257/139 |
| 6,737,705 | B2 | | 5/2004 | Momota et al. |
| 7,977,704 | B2 | * | 7/2011 | Koyama et al. ............... 257/139 |
| 2005/0032280 | A1 | * | 2/2005 | Yanagisawa ................. 438/138 |
| 2006/0063335 | A1 | * | 3/2006 | Kurosaki et al. ............. 438/270 |

FOREIGN PATENT DOCUMENTS

| JP | A-2001-332728 | 11/2001 |
| JP | A-2010-10556 | 1/2010 |

OTHER PUBLICATIONS

Office Action dated Sep. 11, 2012 issued in corresponding JP Application No. 2010-260700.

* cited by examiner

*Primary Examiner* — Eva Y Montalvo
(74) *Attorney, Agent, or Firm* — Posz Law Group, PLC

(57) ABSTRACT

An insulated gate semiconductor device includes a semiconductor substrate, a drift layer on the substrate, a base layer on the drift layer, a ring-shaped gate trench dividing the base layer into a channel layer and a floating layer, an emitter region located in the channel layer to be in contact with a side surface of the gate trench, a well region located on the periphery of a cell area of the base layer and having a depth greater than a depth of the base layer, and a ring-shaped buffer trench located adjacent to and spaced from the gate trench in a length direction of the gate trench. An edge of the well region is located in an area enclosed by the buffer trench in the length direction of the gate trench.

6 Claims, 8 Drawing Sheets

INSULATED GATE SEMICONDUCTOR DEVICE WITH WELL REGION EDGE POSITIONED WITHIN RING-SHAPED BUFFER TRENCH

CROSS REFERENCE TO RELATED APPLICATION

This application is based on and claims priority to Japanese Patent Application No. 2010-98752 filed on Apr. 22, 2010 and No. 2010-260700 filed on Nov. 23, 2010, the contents of which are incorporated herein by reference.

FIELD OF THE INVENTION

The present invention relates to an insulated gate semiconductor device having a trench gate structure.

BACKGROUND OF THE INVENTION

A conventional insulated gate semiconductor device, for example, disclosed in U.S. Pat. No. 6,737,705 corresponding to JP-A-2001-308327, has an element region where a P-type base layer is formed on an N-type drift layer and divided by trenches into channel portions and floating portions. Each trench penetrates the base layer and reaches the drift layer.

An emitter region is formed in the channel portion but is not formed in the floating portion. The emitter region is in contact with a side surface of the trench in the channel portion. The channel portions and the floating portions are repeatedly arranged in a predetermined pattern.

In general, a P-type diffusion layer (i.e., so-called P-well) is formed on the periphery of the element region. The depth of the diffusion layer is greater than the depth of the floating portion. The diffusion layer is located close to the end of the trench in the length direction of the trench to reduce electric field concentration on the end of the trench.

However, as the diffusion layer is located closer to the end of the trench, it is more difficult to allow the floating portion to electrically float with respect to the diffusion layer. In contrast, as the diffusion layer is located farther away from the end of the trench, breakdown voltage of the element decreases due to an increase in the electric field concentration on the end of the trench.

SUMMARY OF THE INVENTION

In view of the above, it is an object of the present invention to provide a semiconductor device for allowing a floating portion to electrically float with respect to a diffusion layer on the periphery of an element region without reducing an element breakdown voltage.

According to an aspect of the present invention, a first conductivity type semiconductor substrate, a second conductivity type drift layer, a first conductivity type base layer, a ring-shaped gate trench, a second conductivity type emitter region, a gate insulating layer, a first conductivity type well region, an emitter electrode, a collector electrode, and a ring-shaped buffer trench. The semiconductor substrate has a front surface and a back surface opposite to the front surface. The drift layer is formed on the front surface of the semiconductor substrate. The base layer is formed on the drift layer and has a cell area. The gate trench is formed in the cell area and reaches the drift layer by penetrating and dividing the base layer into a channel layer and a floating layer. The emitter region is formed in the channel layer and in contact with a side surface of the gate trench. The gate insulating layer is formed on the gate trench. The gate electrode is formed on the gate insulating layer. The well region is formed on the periphery of the cell area and deeper than the base layer. The emitter electrode is electrically connected to the emitter region. The collector electrode is formed on the back surface of the semiconductor substrate. The buffer trench is formed adjacent to and spaced from the gate trench in a length direction of the gate trench. An edge of the well region is located in an area enclosed by the buffer trench in the length direction of the gate trench.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

Figure 1:
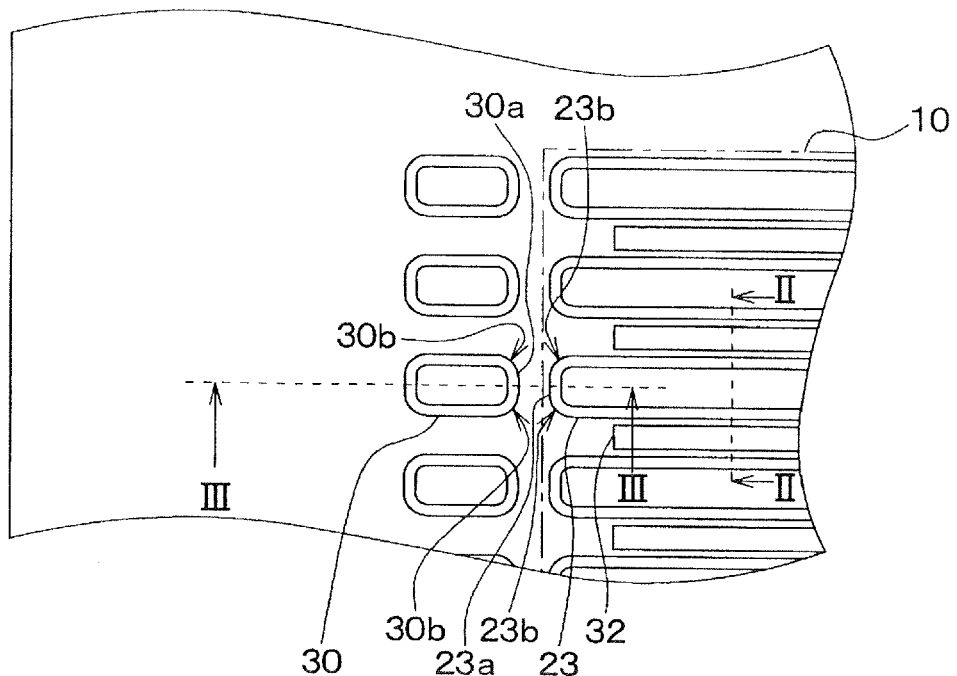
FIG. 1 is a diagram illustrating a partial plan view of a semiconductor chip according to a first embodiment of the present invention.

Embodiments of the present invention are described below with reference to the drawings. Throughout the embodiments, the same symbols are given to the same or corresponding parts in the drawings. It is noted that, throughout the embodiments, P-type and P+-type correspond to a first conductivity-type in claims, and N-type and N+-type correspond to a second conductivity-type in claims.

First Embodiment

A semiconductor chip, as an insulated gate semiconductor device, according to a first embodiment of the present invention is described below with reference to FIGS. 1A-1C. For example, the semiconductor chip can be used as a power switching device for a power supply circuit such as an inverter or a DC/DC converter.

Figure 2:
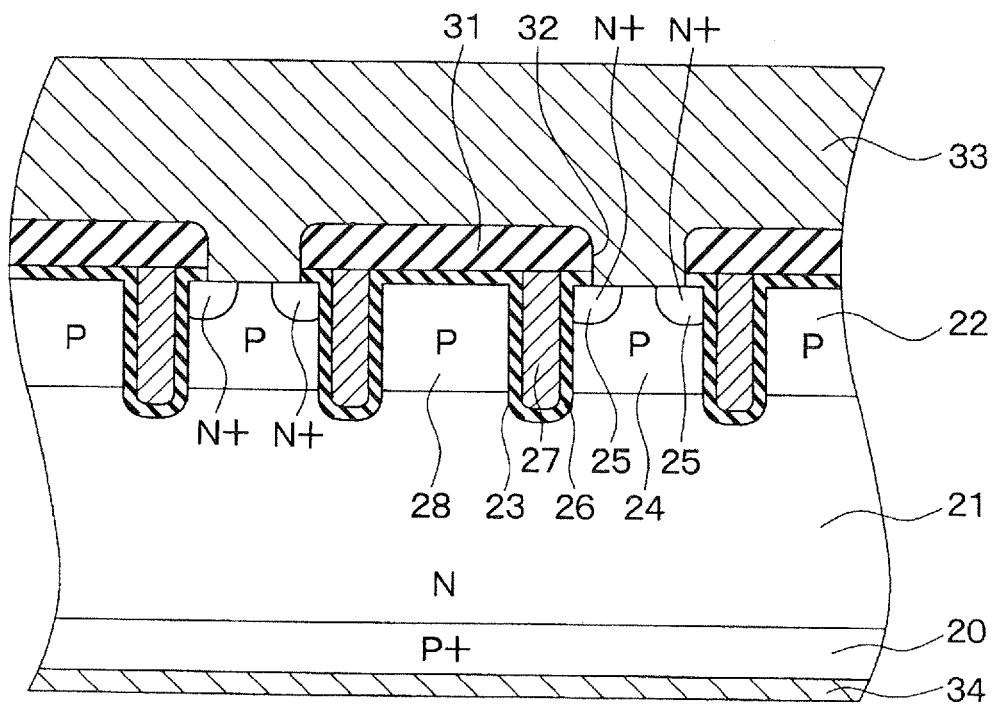
FIG. 2 is a diagram illustrating a cross-sectional view taken along the line II-II in FIG. 1.
Figure 3:
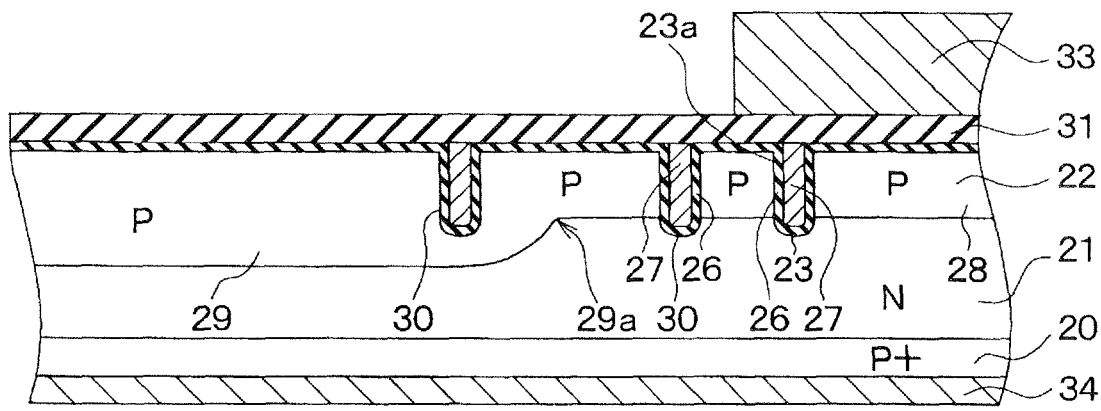
FIG. 3 is a diagram illustrating a cross-sectional view taken along the line III-III in FIG. 1.

FIG. 1 is a diagram illustrating a partial plan view of a semiconductor chip according to a first embodiment of the present invention. Specifically, FIG. 1 illustrates a corner portion of the semiconductor chip. FIG. 2 is a diagram illustrating a cross-sectional view taken along the line II-II in FIG. 1. FIG. 3 is a diagram illustrating a cross-sectional view taken along the line III-III in FIG. 1.

As shown in FIG. 1, the semiconductor chip has a cell area 10. The cell area 10 is an area where an insulated gate bipolar transistor (IGBT) element is formed. As shown in FIG. 2, the IGBT element is formed in a P-type semiconductor substrate 20. An N-type drift layer 21 is formed on a main surface of the semiconductor substrate 20 by epitaxial growth or the like. An impurity concentration of the drift layer 21 is less than an impurity concentration of the semiconductor substrate 20. Further, a P-type base layer 22 having a predetermined thickness is formed on the drift layer 21.

The base layer 22 is divided by gate trenches 23 into P-type channel layers 24 and floating layers 28. Each gate trench 23 reaches the drift layer 21 by penetrating the base layer 22. The gate trenches 23 are arranged at regular intervals. The gate trench 23 has a length direction parallel to a surface of the base layer 22. According to the first embodiment, as shown in FIG. 1, the gate trench 23 has a ring shape like an ellipse.

The base layer 22 located between adjacent gate trenches 23 (i.e., the base layer 22 located outside the ring shape of the gate trench 23) is the P-type channel layer 24 for providing a channel region. An N+-type emitter region 25 is formed in a surface portion of the channel layer 24. An impurity concentration of the emitter region 25 is greater than an impurity concentration of the drift layer 21. The emitter region 25 is terminated inside the channel layer 24 and in contact with a side surface of the gate trench 23.

More specifically, the emitter region 25 has a rod shape extending in the length direction of the gate trench 23. The emitter region 25 is located between adjacent gate trenches 23 and in contact with the side surface of the gate trench 23. An end of the emitter region 25 is located before the end of the gate trench 23 in the length direction. For example, the depth of the channel layer 24 can be 4 micrometers (μm), the depth of the gate trench 23 can be 5 μm, and the interval between adjacent gate trenches 23 can be 5 μm.

An inner surface of each gate trench 23 is covered with a gate insulating layer 26. A gate electrode 27 is formed on the gate insulating layer 26. For example, the gate electrode 27 can be made of polysilicon. The gate electrode 27 extends along the length direction of the gate trench 23 and is connected to a corresponding gate pad (not shown). In this way, the gate trench 23 is filled with the gate insulating layer 26 and the gate electrode 27 so that a trench gate structure can be formed.

The base layer 22 located inside the ring shape of the gate trench 23 (i.e., the base layer 22 having no emitter region 25) is the floating layer 28.

In summary, the base layer 22 is divided by the gate trenches 23 into the channel layers 24, each of which has the emitter region 25, and the floating layers 28, each of which has no emitter region 25. The emitter region 25 are repeatedly formed in the divided base layers 22 in a predetermined pattern so that the channel layer 24 and the floating layer 28 can be repeatedly arranged in the predetermined pattern. Thus, in the cell area 10, the IGBT element and a dummy element are alternately arranged so that adjacent IGBT elements can be spaced from each other by the dummy element. Therefore, the semiconductor chip according to the first embodiment can be called the "spaced-type IGBT device".

As shown in FIG. 3, a P-type outer well region 29 is formed on the periphery of the cell area 10. The depth of the outer well region 29 is greater than the thickness of the base layer 22 and the depth of the gate trench 23. For example, the depth of the outer well region 29 can be 8 μm.

As shown in FIG. 1, a ring-shaped buffer trench 30 is located adjacent to and spaced from an end portion 23a of the gate trench 23 in the length direction of the gate trench 23. The buffer trench 30 is located between the gate trench 23 and the outer well region 29 in the length direction of the gate trench 23. According to the first embodiment, the buffer trench 30 is provided for each gate trench 23.

As shown in FIG. 3, the buffer trench 30 is filled with the gate insulating layer 26 and the gate electrode 27. The gate electrode 27 of the buffer trench 30 serves as a dummy electrode. Further, the gate insulating layer 26 is formed over a surface of an area enclosed by the buffer trench 30 and over a surface of the outer well region 29.

Specifically, an edge portion 29a of the outer well region 29 is located in the area enclosed by the buffer trench 30 so that the outer well region 29 does not reach the gate trench 23. In other words, the buffer trench 30 is partially located in the outer well region 29. Thus, the outer well region 29 and the floating layer 28 are spaced from each other without crossing each other. Therefore, the floating layer 28 can be surely electrically insulated from the outer well region 29. A position of the edge portion 29a of the outer well region 29 is determined based on a position of a mask used for ion implantation.

Likewise, the edge portion 29a of the outer well region 29 is located in a region between adjacent buffer trenches 30. FIG. 1 illustrates a layout of the gate trench 23, the outer well region 29, and the buffer trench 30 on one side in the length direction of the gate trench 23. The gate trench 23, the outer well region 29, and the buffer trench 30 are laid out on the other side in the length direction of the gate trench 23 in the same manner as on the side shown in FIG. 1.

For example, a separation distance between the end portion 23a of the gate trench 23 and an end portion 30a of the buffer trench 30 in the length direction of the gate trench 23 can be 4 μm. The separation distance of 4 μm is suitable to reduce electric field concentration.

The end portion 23a of the gate trench 23 and the end portion 30a of the buffer trench 30 are located facing each other with the separation distance. The end portion 23a of the gate trench 23 has a rounded corner 23b, and the end portion 30a of the buffer trench 30 has a rounded corner 30b. For example, it is preferable that the rounded corners 23b, 30b have a radius of 1 μm or more.

Since the end portion 23a of the gate trench 23 and the end portion 30a of the buffer trench 30 have the rounded corners 23b, 30b, respectively, electric field concentration on the end portions 23a, 30a can be reduced.

An interlayer insulating layer 31 is formed on the gate insulating layer 26 and the gate electrode 27. For example, the interlayer insulating layer 31 can be a boron phosphorus silicon glass (BPSG) layer. A contact hole 32 is formed in the gate insulating layer 26 and the interlayer insulating layer 31. The channel layer 24 and part of the emitter region 25 are exposed through the contact hole 32.

An emitter electrode 33 is formed on the interlayer insulating layer 31 and electrically connected to the channel layer 24 and the emitter region 25 through the contact hole 32. For example, the emitter electrode 33 is formed in the cell area 10. A collector electrode 34 is formed on a back side of the semiconductor substrate 20.

Next, a method of manufacturing the semiconductor chip according to the first embodiment is described below. Firstly, a P-type wafer is prepared, and the N-type base layer 22 is formed on a surface of the wafer by epitaxial growth. Further, the outer well region 29 is formed on the periphery of the cell area 10 by ion implantation and thermal diffusion.

Then, the gate trenches 23 are formed in the cell area 10 in such a manner that each gate trench 23 reaches the drift layer 21 by penetrating the base layer 22. At the same time, the ring-shaped buffer trench 30 is formed adjacent to and spaced from the corresponding gate trench 23 in the length direction of the gate trench 23.

Then, the gate insulating layer 26 is formed by thermally oxidizing the inner surfaces of the gate trench 23 and the buffer trench 30 in an atmosphere of oxygen. Then, the gate electrode 27 is formed by forming polysilicon on the gate insulating layer 26 by chemical vapor deposition (CVD) or the like. Then, after removing an unnecessary portion of the polysilicon on the gate insulating layer 26, the interlayer insulating layer 31 is formed on the gate insulating layer 26 by CVD or the like, so that the gate electrode 27 can be covered with the interlayer insulating layer 31. Then, the contact hole 32 is formed in the gate insulating layer 26 and the interlayer insulating layer 31 by photolithography and etching processes. Then, the emitter electrode 33 is formed by forming a metal layer such as an aluminum (Al) layer on the interlayer insulating layer 31 so that the contact hole 32 can be filled with the metal layer. At the same time, the gate pad is formed.

Further, the collector electrode 34 is formed by forming a metal layer such as an aluminum (Al) layer on the back side of the wafer after grinding and polishing the back side of the wafer. Then, the wafer is cut into individual chips. Thus, the semiconductor chip according to the first embodiment can be manufactured.

As described above, according to the first embodiment, the ring-shaped buffer trench 30 is located adjacent to and spaced from the gate trench 23 in the length direction of the gate trench 23. Further, the outer well region 29 is located on the periphery of the cell area 10 in such a manner that the edge portion 29a of the outer well region 29 is located in the area enclosed by the buffer trench 30 in the length direction of the gate trench 23.

Thus, the outer well region 29 and the floating layer 28 are spaced from each other without crossing each other, so that the floating layer 28 can be electrically insulated from the outer well region 29. Therefore, the floating layer 28 can electrically float with respect to the outer well region 29.

Since the floating layer 28 electrically floats, holes are collected in the drift layer 21 below the floating layer 28 so that the concentrations of the holes and electrons in the drift layer 21 can be increased. As a result, conductivity modulation occurs so that a resistance of the drift layer 21 can be reduced. Thus, an on-voltage of the IGBT element can be reduced.

Further, since the buffer trench 30 is partially located in the outer well region 29, the electric field concentration on the buffer trench 30 can be reduced by the outer well region 29. Thus, a reduction in a breakdown voltage of the IGBT element can be prevented.

Figure 4:
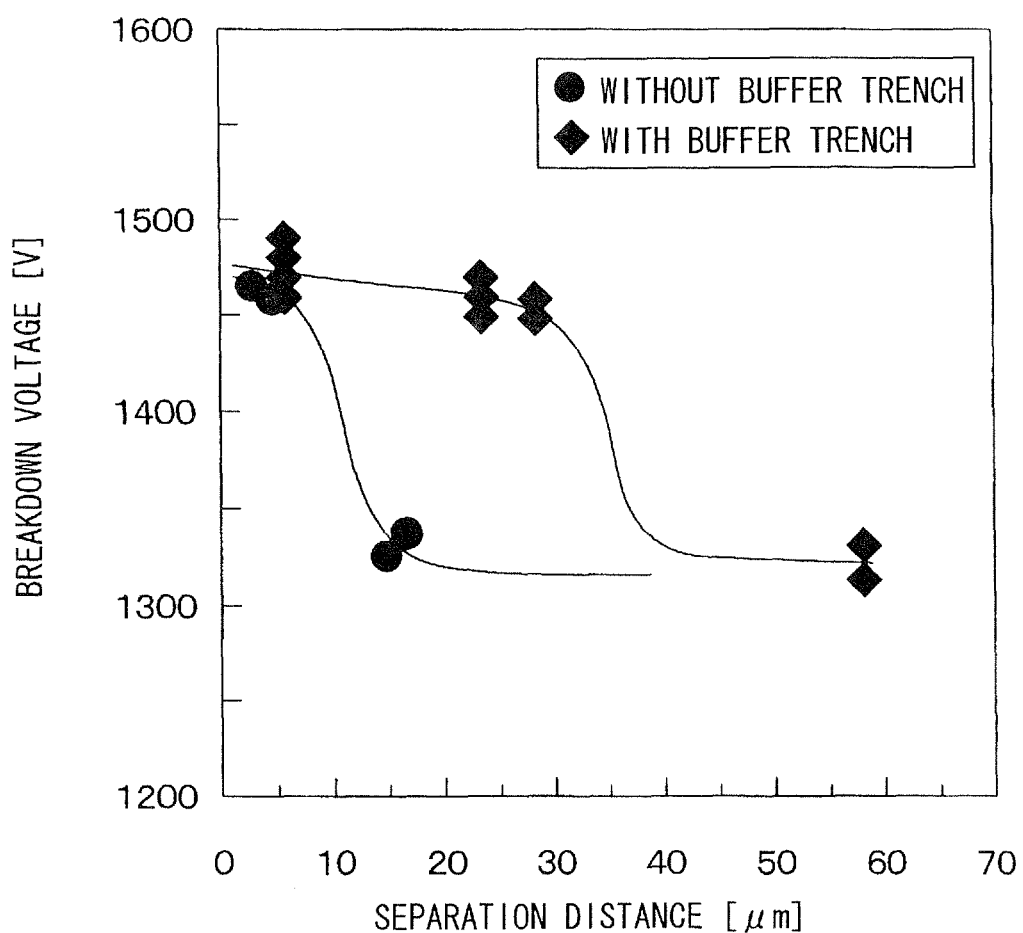
FIG. 4 is a diagram illustrating a relationship between a breakdown voltage of an IGBT element and a separation distance between an outer well region and a gate trench.

The present inventors have conducted an experiment to measure a breakdown voltage of an IGBT element of a semiconductor chip having the buffer trench 30 and a breakdown voltage of an IGBT element of a semiconductor chip having no buffer trench 30. FIG. 4 is a diagram illustrating the result of the experiment. In FIG. 4, the horizontal axis represents a separation distance between the edge portion 29a of the outer well region 29 and the end portion 23a of the gate trench 23 in the length direction of the gate trench 23, and the vertical axis represents the breakdown voltages of the IGBT elements. In FIG. 4, solid rhombuses represent the semiconductor chip having the buffer trench 30, and solid circles represent the semiconductor chip having no buffer trench 30.

The experiment has been conducted by using a semiconductor chip having a resistivity of 55 Ω·m and a thickness of 125 μm. The resistivity of the semiconductor chip corresponds to a resistivity of the drift layer 21, and the thickness of the semiconductor chip corresponds to the sum of the thicknesses of the semiconductor substrate 20, the drift layer 21, and the base layer 22. The experiment has been conducted at room temperature.

As can be seen from FIG. 4, the IGBT element of the semiconductor chip without the buffer trench 30 can have a high breakdown voltage of about 1450V, when the separation distance is very small and less than 5 μm. However, when the separation distance exceeds 5 μm, the breakdown voltage of the IGBT element of the semiconductor chip without the buffer trench 30 sharply decreases. A reason for this is that electric field concentration occurs on the end portion 23a of the gate trench 23.

The IGBT element of the semiconductor chip with the buffer trench 30 can have a high breakdown voltage of about 1450V, when the separation distance is very small and less than 5 μm. Further, the breakdown voltage of the IGBT element of the semiconductor chip with the buffer trench 30 is maintained above 1450V over a range of the separation distance from 5 μm to 30 μm. In particular, according to the first embodiment, the end portion 23a of the gate trench 23 and the end portion 30a of the buffer trench 30 have the respective rounded corners 23b, 30b for reducing the electric field concentration. Therefore, a reduction in the breakdown voltage can be reduced effectively.

As described above, according to the first embodiment, the semiconductor chip has the buffer trench 30 for reducing the electric field concentration without locating the outer well region 29 closer to the end portion 23a of the gate trench 23. Therefore, the high breakdown voltage can be achieved with the floating layer 28 electrically floating with respect to the outer well region 29.

Second Embodiment

Figure 5:
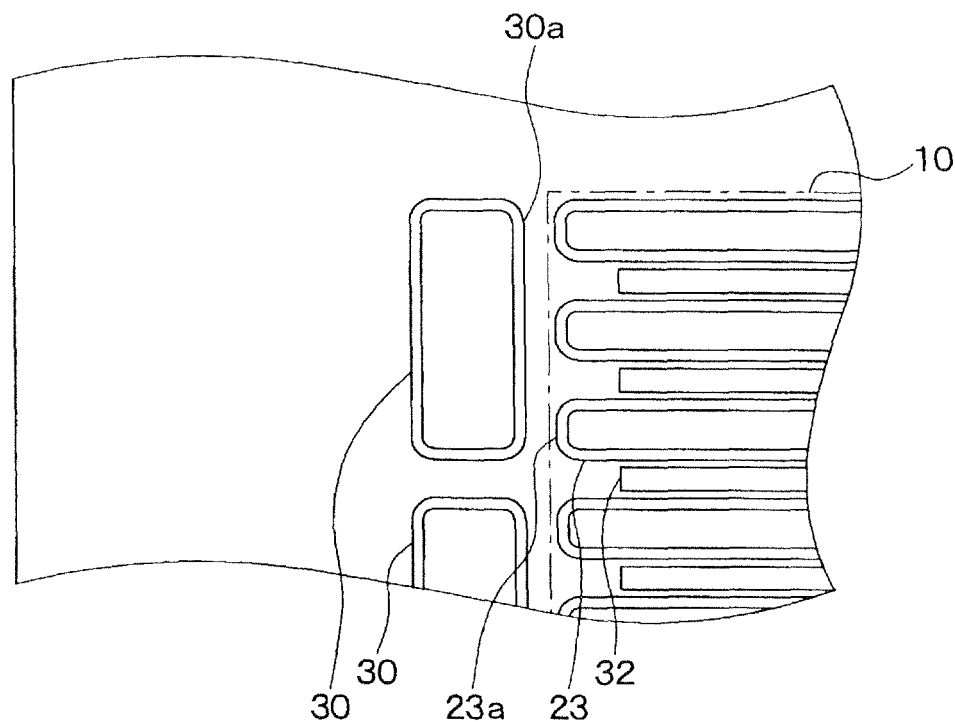
FIG. 5 is a diagram illustrating a partial plan view of a semiconductor chip according to a second embodiment of the present invention.

A second embodiment of the present invention is described below with reference to FIG. 5. FIG. 5 is a diagram illustrating a partial plan view of a semiconductor chip according to the second embodiment of the present invention. A difference of the second embodiment from the first embodiment is as follows.

According to the second embodiment, one buffer trench 30 is provided for every two or more buffer trenches 30. In an example shown in FIG. 5, one buffer trench 30 is provided for every three buffer trenches 30. In this way, one buffer trench 30 can be shared among multiple buffer trenches 30.

Third Embodiment

A third embodiment of the present invention is described below with reference to FIGS. 6 and 7. A difference of the third embodiment form the preceding embodiments is as follows.

According to the preceding embodiments, the buffer trench 30 is provide adjacent to the gate trench 23 in the length direction of the gate trench 23, and the position of the edge portion 29a of the outer well region 29 in the length direction of the gate trench 23 is specified in such a manner that the edge portion 29a is located in the area enclosed by the buffer trench 30.

In contrast, according to the third embodiment, the position of the edge portion 29a of the outer well region 29 in the width direction, perpendicular to the length direction, of the gate trench 23 is specified.

Figure 6:
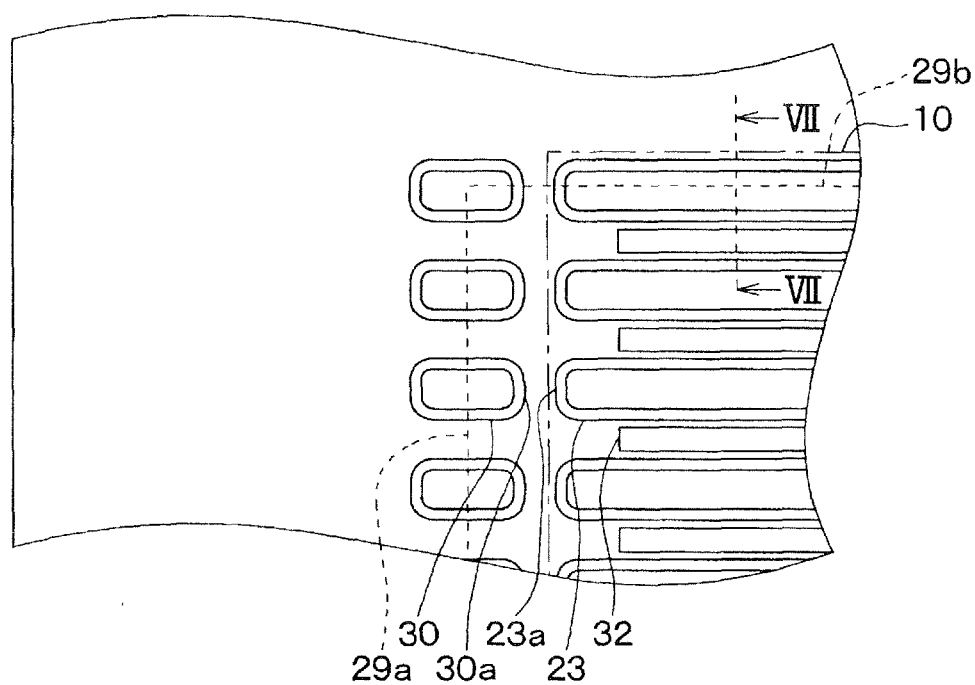
FIG. 6 is a diagram illustrating a partial plan view of a semiconductor chip according to a third embodiment of the present invention.

FIG. 6 is a diagram illustrating a partial plan view of a semiconductor chip according to the third embodiment of the present invention. FIG. 7 is a diagram illustrating a cross-sectional view taken along the line VII-VII in FIG. 6.

As shown in FIG. 6, in the length direction of the gate trench 23, the outer well region 29 is positioned with respect to the cell area 10 in such a manner that the edge portion 29a of the outer well region 29 is located in the area enclosed by the buffer trench 30.

Figure 7:
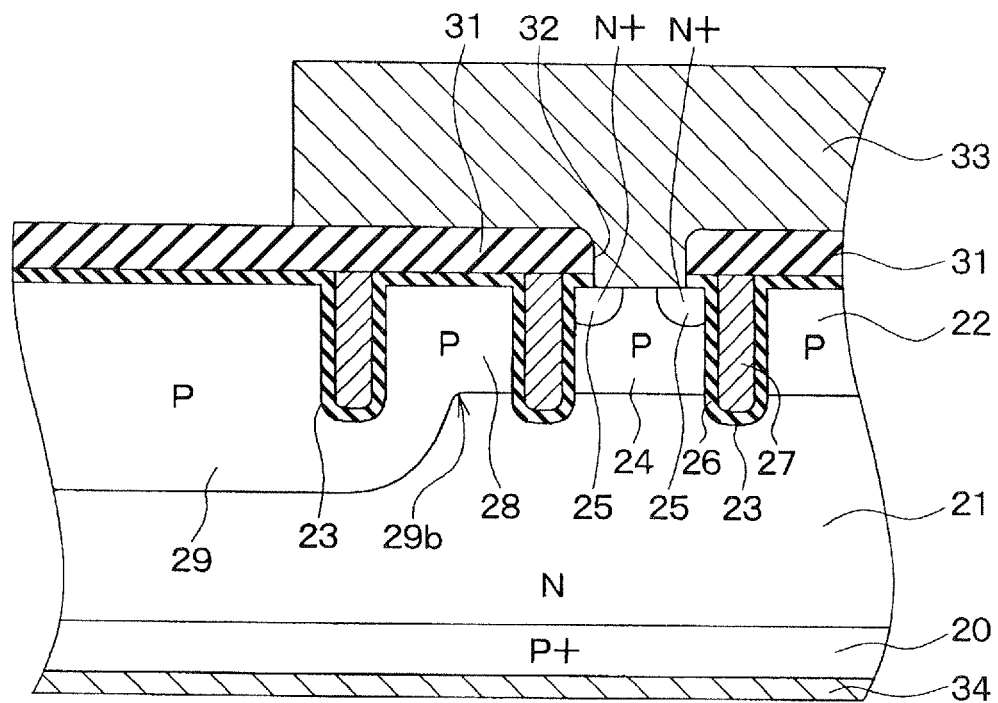
FIG. 7 is a diagram illustrating a cross-sectional view taken along the line VII-VII in FIG. 6.

As shown in FIGS. 6 and 7, in the width direction of the gate trench 23, the outer well region 29 is positioned with respect to the cell area 10 in such a manner that the edge portion 29a of the outer well region 29 is located in the floating layer 28 enclosed by the outer most gate trench 23 that is located closer to the outer well region 29 than any other gate trench 23.

In other words, the outer most gate trench 23 is partially located in the outer well region 29. In such an approach, the electric field concentration on the outer most gate trench 23 can be reduced by the outer well region 29.

As described above, according to the third embodiment, the electric field concentration can be reduced not only in the length direction but also in the width direction of the gate trench 23. Thus, the electric field concentration is reduced on the entire periphery of the cell area 10 so that the reduction in the breakdown voltage can be surely prevented.

FIG. 6 illustrates a layout of the gate trench 23, the outer well region 29, and the buffer trench 30 on one side in the width direction of the gate trench 23. The gate trench 23, the outer well region 29, and the buffer trench 30 are laid out on the other side in the width direction of the gate trench 23 in the same manner as on the side shown in FIG. 6.

Fourth Embodiment

Figure 8:
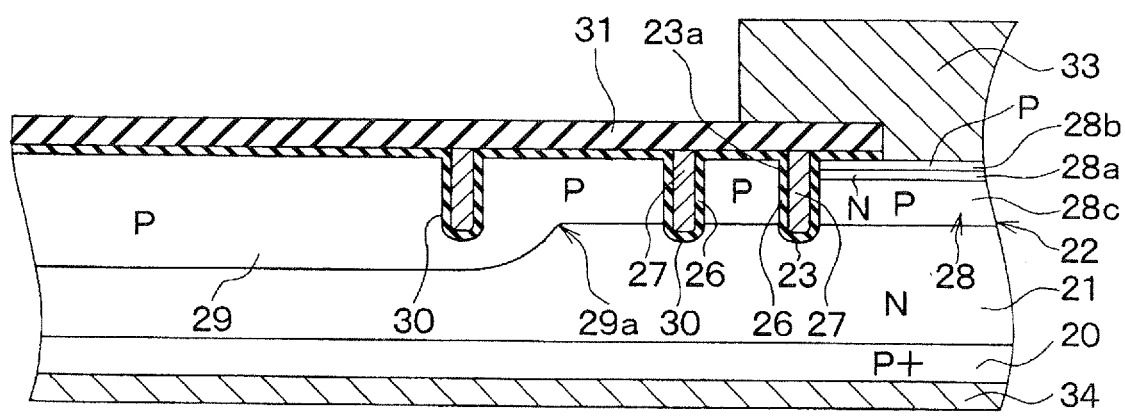
FIG. 8 is a diagram illustrating a partial cross-sectional view of a semiconductor chip according to a fourth embodiment of the present invention.

A fourth embodiment of the present invention is described below with reference to FIG. 8. FIG. 8 is a diagram illustrating a partial cross-sectional view of a semiconductor chip according to a fourth embodiment. FIG. 8 corresponds to FIG. 3. A difference of the fourth embodiment from the preceding embodiments is as follows.

According to the fourth embodiment, as shown in FIG. 8, an N-type hole stopper layer 28a is formed in the floating layer 28. The floating layer 28 is divided by the hole stopper layer 28a into a first layer 28b and a second layer 28c in a depth direction of the gate trench 23. The first layer 28b is located closer to an opening of the gate trench 23 than the second layer 28c. In other words, the second layer 28c is located closer to a bottom of the gate trench 23 than the first layer 28b. The first layer 28b and the second layer 28c are completely, electrically isolated from each other by the hole stopper layer 28a. It is noted that the depth of the gate trench 23 is measured relative to an interface between the floating layer 28 and the emitter electrode 33.

In the base layer 22, the hole stopper layer 28a is formed in only the floating layer 28. That is, the hole stopper layer 28a is not formed in the channel layer 24. Therefore, the hole stopper layer 28a is located in the IGBT element but is not located in the dummy element having no channel region.

The hole stopper layer 28a is located in a surface portion of the floating layer 28 in the depth direction of the gate trench 23. It is preferable that the depth of the hole stopper layer 28a be less than half of the depth of the gate trench 23. It is noted that the depth of the hole stopper layer 28a is measured relative to the interface between the floating layer 28 and the emitter electrode 33. For example, assuming that the depth of the gate trench 23 is about 5 μm, the hole stopper layer 28a can have a thickness of 0.3 μm and be located at a depth of 0.8 μm from the interface between the floating layer 28 and the emitter electrode 33.

The hole stopper layer 28a can be formed by an ion implantation process using a mask and an annealing process. For example, ion implantation of dopants such as phosphorus (P) can be performed with a concentration of about from $1\times10^{12}/cm^2$ to about $1\times10^{13}/cm^2$ and with an energy of about 500 keV. Then, annealing for activating the implanted dopants can be performed at a temperature of 900° C. or more. Alternatively, after ion implantation of phosphorus and annealing for activating the implanted phosphorus are performed, ion implantation of boron (B) and annealing for activating the implanted boron can be performed. In this case, the hole stopper layer 28a formed in the floating layer 28 can have a surface concentration of about $1\times10^{12}/cm^2$.

The emitter electrode 33 is electrically connected to each of the emitter region 25 of the channel layer 24 and the first layer 28b of the floating layer 28. Thus, the first layer 28b is emitter-grounded.

Since the first layer 28b is electrically connected to the emitter electrode 33, the floating layer 28 is clamped to a potential (i.e., GND) of the emitter electrode 33. In such an approach, a large amount of charge trapped in the floating layer 28 is emitted to the emitter electrode 33 at the time of switching of the IGBT element. Therefore, there is almost no charge trapped in a feedback capacitor formed in a path from the collector electrode 34 to the gate electrode 27 through the floating layer 28. Accordingly, there is almost no charge discharged at the time of switching. Thus, switching time is reduced so that switching loss can be reduced.

Further, the N-type hole stopper layer 28a in the P-type floating layer 28 can serve as a potential barrier. Therefore, although the first layer 28b of the floating layer 28 is emitter-grounded, the hole stopper layer 28a reduces the number of holes drawn from the drift layer 21 through the floating layer 28 to the emitter electrode 33. Thus, it is less likely that holes flowing in the drift layer 21 are drawn to the emitter electrode 33. As a result, the concentrations of holes and electrons in the drift layer 21 are increased so that the conductivity modulation can be accelerated. Thus, the resistance of the drift layer 21 is reduced so that the on-voltage of the IGBT element can be reduced.

Further, the buffer trench 30 allows the floating layer 28 to electrically float with respect to the outer well region 29.

Thus, the on-voltage of the IGBT element can be reduced without reducing the breakdown voltages of the IGBT element.

If there is no buffer trench 30, the outer well region 29 deeper than the floating layer 28 is formed after the hole stopper layer 28a is formed in the floating layer 28. In this case, the outer well region 29 is formed in such a manner that the edge portion 29a of the outer well region 29 overlaps an edge portion of the floating layer 28 in the length direction of the gate trench 23. As a result, the hole stopper layer 28a is destroyed by the outer well region 29.

In contrast, according to the fourth embodiment, because of the buffer trench 30, there is no need that the edge portion 29a of the outer well region 29 overlaps the floating layer 28 in the length direction of the gate trench 23. Thus, the low on-voltage of the IGBT element can be achieved while keeping the floating layer 28 electrically floating with respect to the outer well region 29 by using the buffer trench 30.

Fifth Embodiment

Figure 9A:
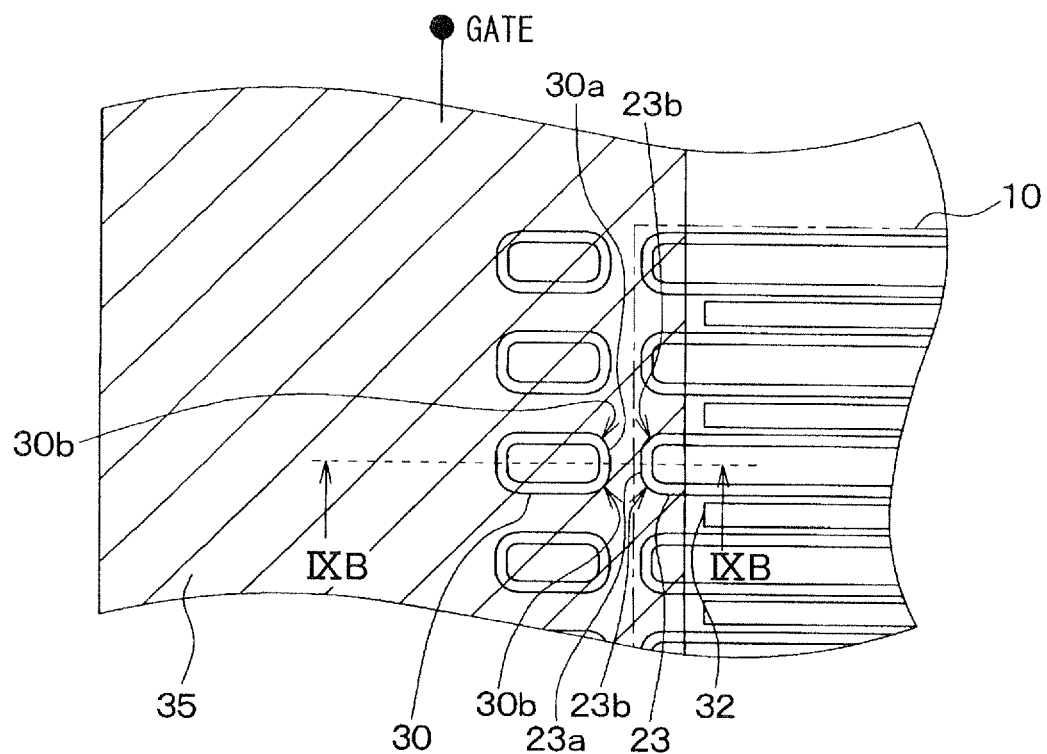
FIG. 9A is a diagram illustrating a partial plan view of a semiconductor chip according to a fifth embodiment of the present invention.
Figure 9B:
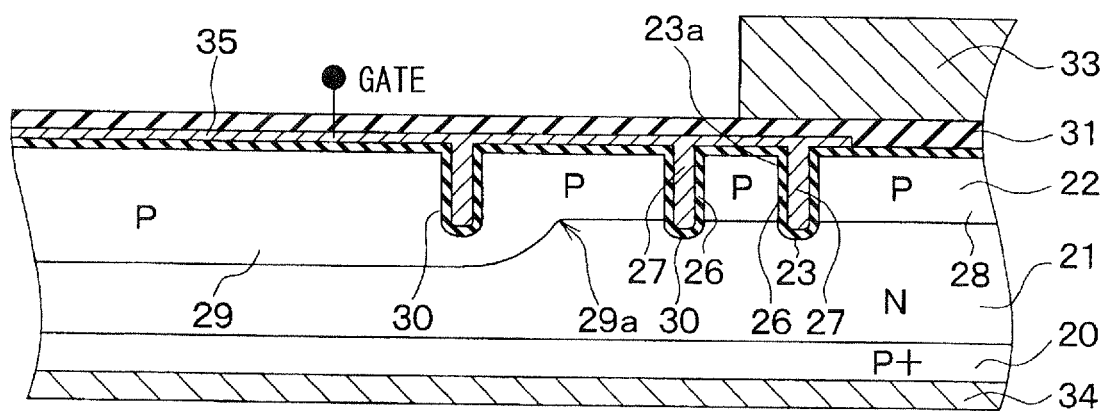
FIG. 9B is a diagram illustrating a cross-sectional view taken along the line IXB-IXB in FIG. 9A.

A fifth embodiment of the present invention is described below with reference to FIGS. 9A and 9B. FIG. 9A is a diagram illustrating a partial plan view of a semiconductor chip according to the fifth embodiment of the present invention, and FIG. 9B is a diagram illustrating a cross-sectional view taken along the line IXB-IXB in FIG. 9A. A difference of the fifth embodiment from the first embodiment is as follows.

As shown in FIG. 9A, according to the fifth embodiment, a wiring layer 35 is formed around the cell area 10 to cover the entire buffer trench 30 and the end portion 23a of the gate trench 23. As can be seen from FIG. 9B, the wiring layer 35 is formed on the gate insulating layer 26.

The wiring layer 35 is electrically connected to each of the gate electrode 27 of the gate trench 23 and the dummy gate electrode 27 of the buffer trench 30. Thus, the dummy gate electrode 27 of the buffer trench 30 is gate-grounded.

As described above, according to the fifth embodiment, the dummy gate electrode 27 of the buffer trench 30 is gate-grounded. For example, the fifth embodiment can be combined with the fourth embodiment so that the hole stopper layer 28a can be located in the floating layer 28 with the dummy gate electrode 27 of the buffer trench 30 gate-grounded.

Sixth Embodiment

Figure 10A:
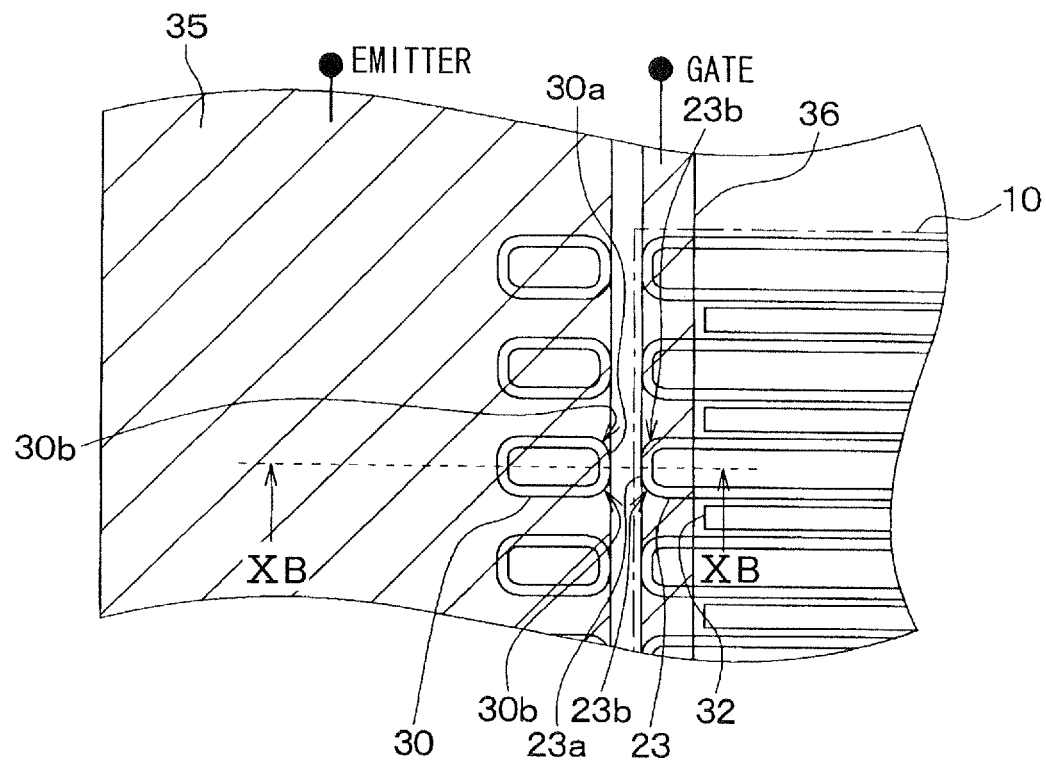
FIG. 10A is a diagram illustrating a partial plan view of a semiconductor chip according to a sixth embodiment of the present invention.
Figure 10B:
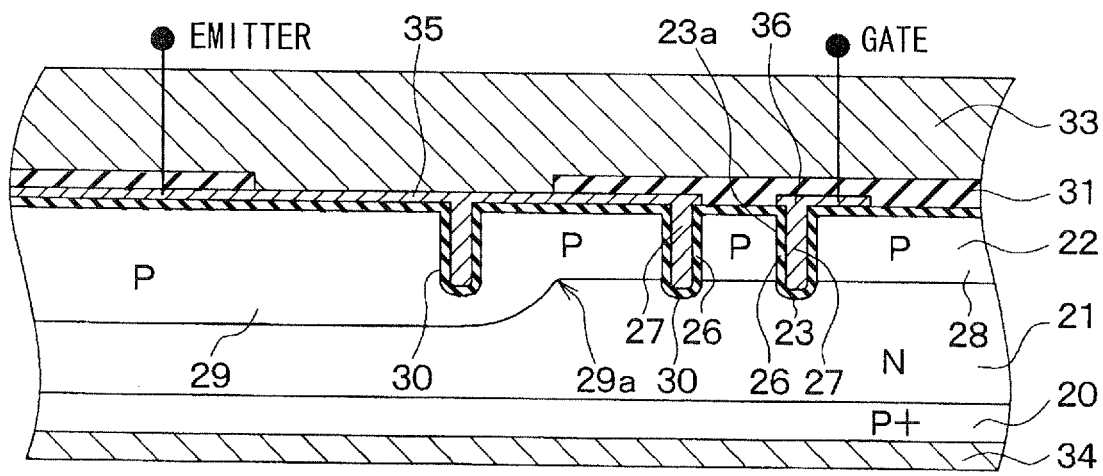
FIG. 10B is a diagram illustrating a cross-sectional view taken along the line XB-XB in FIG. 10A.

A sixth embodiment of the present invention is described below with reference to FIGS. 10A and 10B. FIG. 10A is a diagram illustrating a partial plan view of a semiconductor chip according to the sixth embodiment of the present invention, and FIG. 10B is a diagram illustrating a cross-sectional view taken along the line XB-XB in FIG. 10A. A difference of the sixth embodiment from the fifth embodiment is as follows.

As shown in FIG. 10A, according to the fifth embodiment, the wiring layer 35 is formed around the cell area 10 to cover the entire buffer trench 30. Further, a wiring layer 36 is formed to cover the end portion 23a of the gate trench 23.

As can be seen from FIG. 10B, the wiring layers 35, 36 are formed on the gate insulating layer 26. The wiring layers 35, 36 are electrically insulated from each other by the gate insulating layer 26 and the interlayer insulating layer 31.

The wiring layer 35 is electrically connected to the dummy gate electrode 27 of the buffer trench 30. Further, the wiring layer 35 is exposed through an opening of the interlayer insulating layer 31. The emitter electrode 33 is formed on the interlayer insulating layer 31 and electrically connected to the wiring layer 35 through the opening of the interlayer insulating layer 31. Thus, the dummy gate electrode 27 of the buffer trench 30 is emitter-grounded.

In contrast, the wiring layer 36 is connected to the gate electrode 27 of the gate trench 23. Thus, the gate electrode 27 of the gate trench 23 is gate-grounded.

As described above, according to the sixth embodiment, the dummy gate electrode 27 of the buffer trench 30 is emitter-grounded. For example, the sixth embodiment can be combined with the fourth embodiment so that the hole stopper layer 28a can be located in the floating layer 28 with the dummy gate electrode 27 of the buffer trench 30 emitter-grounded.

Seventh Embodiment

Figure 11A:
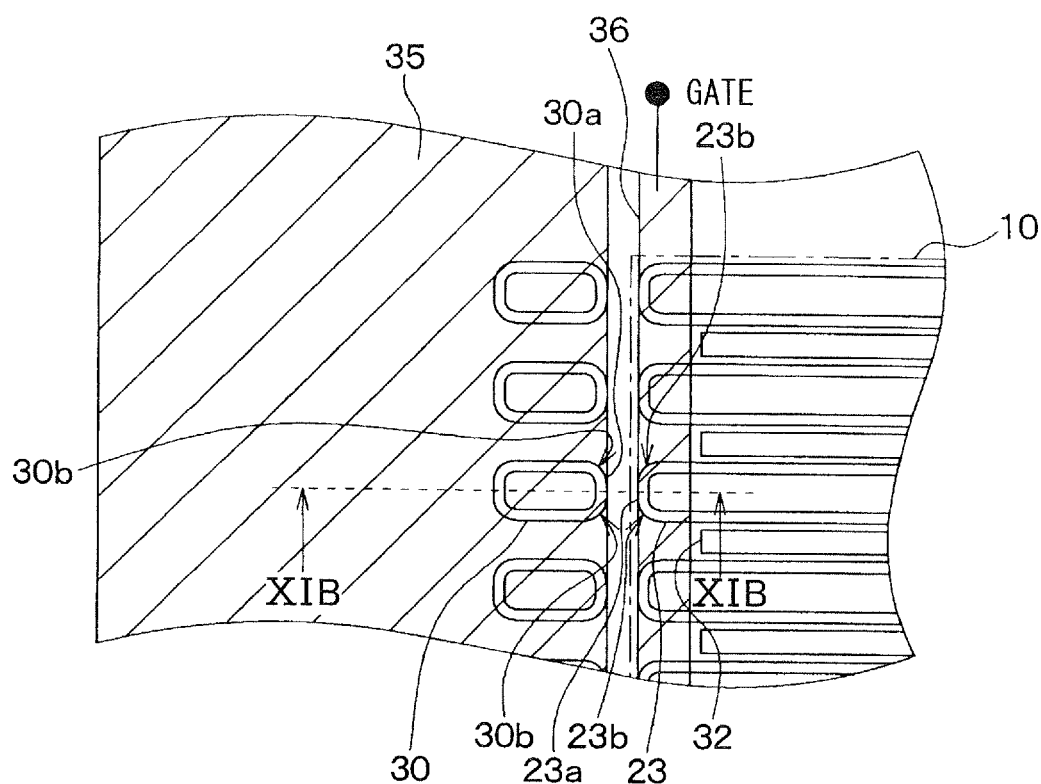
FIG. 11A is a diagram illustrating a partial plan view of a semiconductor chip according to a seventh embodiment of the present invention.
Figure 11B:
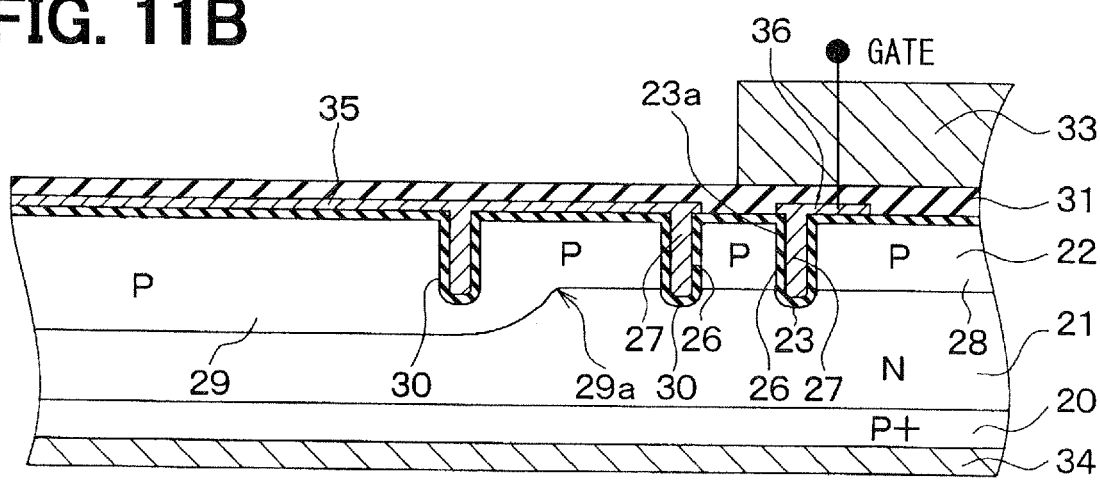
FIG. 11B is a diagram illustrating a cross-sectional view taken along the line XIB-XIB in FIG. 11A.

A seventh embodiment of the present invention is described below with reference to FIGS. 11A and 11B. FIG. 11A is a diagram illustrating a partial plan view of a semiconductor chip according to a seventh embodiment of the present invention, and FIG. 11B is a diagram illustrating a cross-sectional view taken along the line XIB-XIB in FIG. 11A. A difference of the seventh embodiment from the fifth and sixth embodiments is as follows.

As shown in FIG. 11A, according to the seventh embodiment, the wiring layer 35 is formed around the cell area 10 to cover the entire buffer trench 30. Further, the wiring layer 36 is formed to cover the end portion 23a of the gate trench 23.

As can be seen from FIG. 11B, the wiring layers 35, 36 are formed on the gate insulating layer 26. The wiring layers 35, 36 are electrically insulated from each other by the gate insulating layer 26 and the interlayer insulating layer 31. The wiring layer 35 is electrically connected to the dummy gate electrode 27 of the buffer trench 30. The wiring layer 36 is connected to the gate electrode 27 of the gate trench 23. Thus, the gate electrode 27 of the gate trench 23 is gate-grounded.

It is noted that the wiring layer 35 is not electrically connected to any of the gate electrode 27, the emitter electrode 33, and the collector electrode 34. Thus, the dummy gate electrode 27 of the buffer trench 30 electrically floats.

As described above, according to the seventh embodiment, the dummy gate electrode 27 of the buffer trench 30 electrically floats. is emitter-grounded. For example, the seventh embodiment can be combined with the fourth embodiment so that the hole stopper layer 28a can be located in the floating layer 28 with the dummy gate electrode 27 of the buffer trench 30 electrically floating.

Eighth Embodiment

Figure 12:
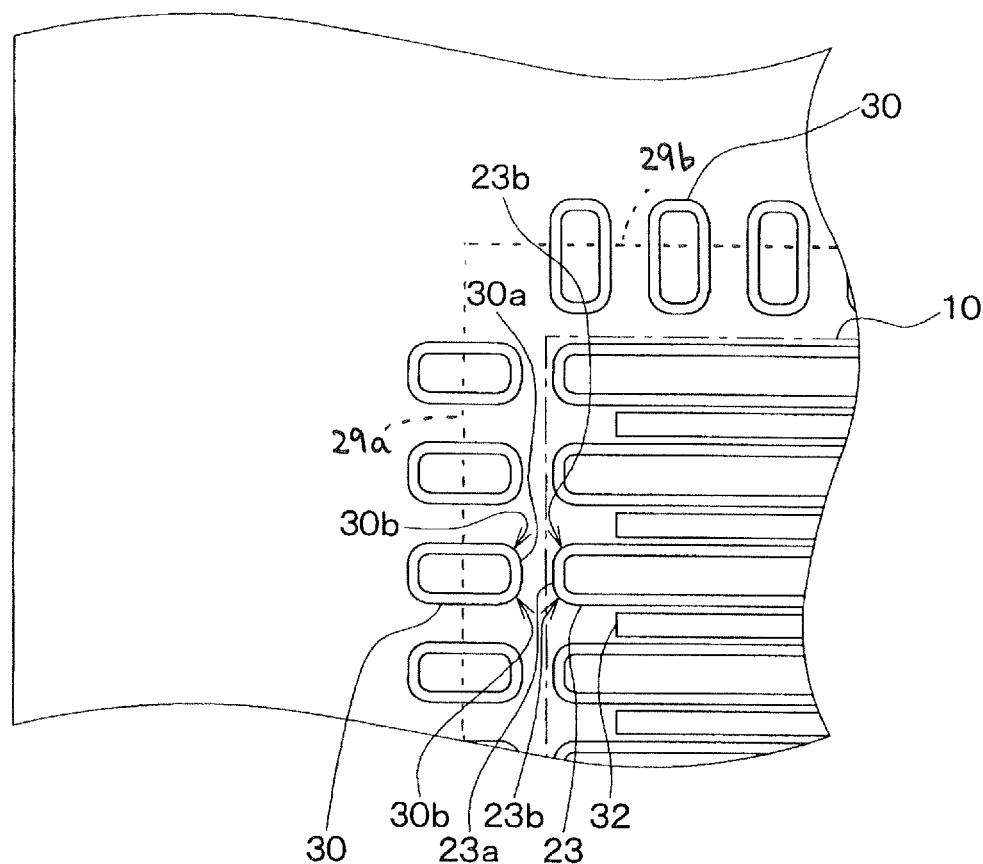
FIG. 12 is a diagram illustrating a partial plan view of a semiconductor chip according to an eighth embodiment of the present invention.

An eighth embodiment of the present invention is described below with reference to FIG. 12. FIG. 12 is a diagram illustrating a partial plan view of a semiconductor chip according to the eighth embodiment of the present invention. A difference of the eighth embodiment from the preceding embodiments is as follows.

As can be seen from FIG. 12, according to the eighth embodiment, the ring-shaped buffer trench 30 is located adjacent to and spaced from the gate trench 23 not only in the length direction of the gate trench 23 but also in the width direction of the gate trench 23.

In the third embodiment described previously, the outermost gate trench 23, which is located closer to the outer well region 29 than any other gate trench 23 in the width direction of the gate trench 23, is used as the buffer trench 30. In contrast, according to the eighth embodiment, another buffer trench 30 is located adjacent to and spaced from the outermost gate trench 23 in the width direction of the gate trench 23. In an example shown in FIG. 12, multiple buffer trenches 30 are arranged along the outermost gate trench 23.

The outer well region 29 is located on the periphery of the cell area 10 in such a manner that the edge portion 29a of the outer well region 29 is located in the area enclosed by the buffer trench 30 in the length direction of the gate trench 23 and that an edge portion 29b of the outer well region 29 is located in an area enclosed by the buffer trench 30 in the width direction of the gate trench 23. Thus, the outer well region 29 and the floating layer 28 are spaced from each other without crossing each other in both the length direction and the width direction, so that the floating layer 28 can be electrically insulated from the outer well region 29. Therefore, the floating layer 28 can electrically float.

An end portion of the buffer trench 30 located adjacent to the outermost gate trench 23 in the width direction of the gate trench 23 can have a rounded corner. For example, the eighth embodiment can be combined with any of the fourth through seventh embodiments.

Ninth Embodiment

Figure 13:
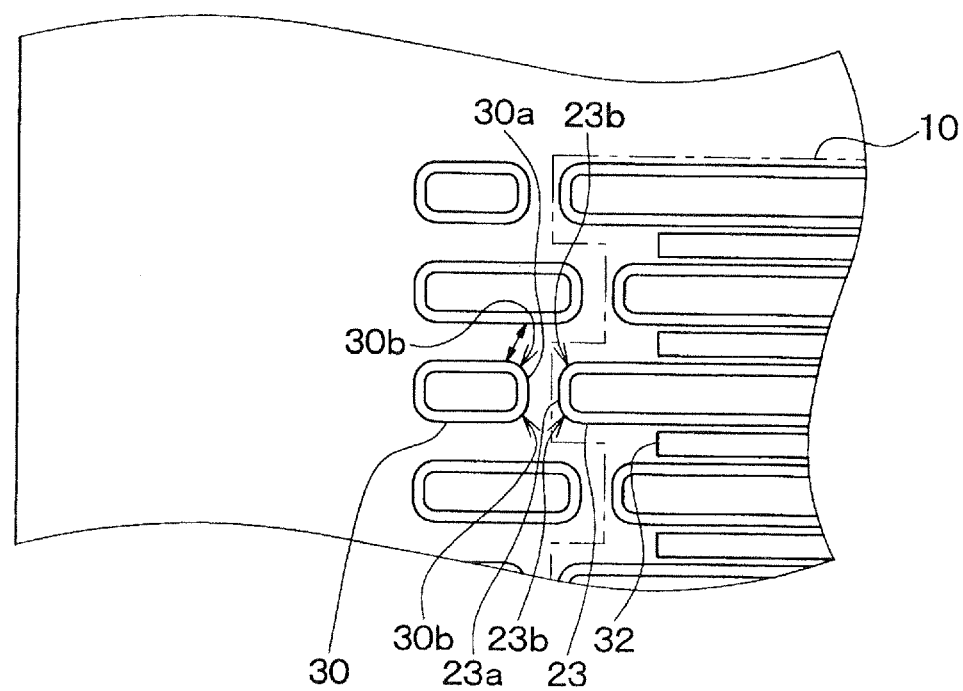
FIG. 13 is a diagram illustrating a partial plan view of a semiconductor chip according to a ninth embodiment of the present invention.

A ninth embodiment of the present invention is described below with reference to FIG. 13. FIG. 13 is a diagram illustrating a partial plan view of a semiconductor chip according to the ninth embodiment of the present invention. A difference of the ninth embodiment from the preceding embodiments is as follows.

In the preceding embodiments, for example, as shown in FIG. 12, the end portions 23a of the gate trenches 23 are aligned in the width direction of the gate trenches 23, and the end portions 30a of the buffer trenches 30 are aligned in the width direction.

In contrast, according to the ninth embodiment, the end portions 23a of the gate trenches 23 are misaligned in the width direction of the gate trenches 23. In an example shown in FIG. 13, the end portions 23a of the gate trenches 23 are arranged in a zigzag pattern in such a manner that one gate trench 23 can be located more inward with respect to the cell area 10 than the gate trenches 23 adjacent to the one gate trench 23.

The end portions 30a of the buffer trenches 30 are misaligned in the width direction of the gate trenches 23 so that a separation distance between each buffer trench 30 and the corresponding gate trench 23 can be constant. In the example shown in FIG. 13, one buffer trench 23 overlaps the gate trench 23 located adjacent to the gate trench 23 corresponding to the one buffer trench 23 in the width direction.

In such an approach, a separation distance between the rounded corner 30b of one buffer trench 30 and the buffer trench 30 adjacent to the one buffer trench 30 can be less than a separation distance between the rounded corner 30b of the one buffer trench 30 and the end portion 23a of one gate trench 23 adjacent to the gate trench 23 corresponding to the one buffer trench 30. Further, the separation distance between the rounded corner 30b of one buffer trench 30 and the buffer trench 30 adjacent to the one buffer trench 30 can be constant. Thus, a local reduction in the breakdown voltage can be prevented.

(Modifications)

The embodiments described above can be modified in various ways. The IGBT element can have a structure different from those described in the embodiments. For example, a P-type contact region can be formed in the channel layer 24.

In the embodiments, one buffer trench 30 is arranged in the length direction of the gate trench 23. Alternatively, another buffer trench 30 can be located outside the one buffer trench 30 in the length direction of the gate trench 23. That is, multiple buffer trenches 30 can be arranged in the length direction of the gate trench 23. In this case, the edge portion 29a of the outer well region 29 is located in an area enclosed by the buffer trench 30 that is located closer to the gate trench 23 than any other buffer trench 30 in the length direction of the gate trench 23.

Such changes and modifications are to be understood as being within the scope of the present invention as defined by the appended claims.

What is claimed is:

1. An insulated gate semiconductor device comprising:
a first conductivity type semiconductor substrate having a front surface and a back surface opposite to the front surface;
a second conductivity type drift layer on the front surface of the semiconductor substrate;
a first conductivity type base layer on the drift layer, the base layer having a cell area;
a ring-shaped gate trench located in the cell area and reaching the drift layer by penetrating and dividing the base layer into a channel layer and a floating layer;
a second conductivity type emitter region located in the channel layer to be in contact with a side surface of the gate trench;
a gate insulating layer on the gate trench;
a gate electrode on the gate insulating layer;
a first conductivity type well region located on the periphery of the cell area and having a depth greater than a depth of the base layer;
an emitter electrode electrically connected to the emitter region;
a collector electrode on the back surface of the semiconductor substrate, and
a ring-shaped buffer trench located adjacent to and spaced from the gate trench in a length direction of the gate trench, wherein
the well region has a first edge in the length direction of the gate trench, and
the first edge of the well region is located in an area enclosed by the buffer trench.

2. The semiconductor device according to claim 1, wherein
the floating layer has a second conductivity type hole stopper layer and is divided by the hole stopper layer into a first layer and a second layer in a depth direction of the gate trench,
the first layer is located closer to an opening of the gate trench than the second layer, and
the emitter electrode is electrically connected to each of the emitter region and the first layer.

3. The semiconductor device according to claim 1, wherein
the gate trench comprises a plurality of gate trenches,
the well region has a second edge in a width direction perpendicular to the length direction,
the second edge of the well region is located in an area enclosed by the outermost gate trench, and
the outermost gate trench is located closer to the well region than any other gate trench in the width direction.

4. The semiconductor device according to claim 1, wherein
the gate trench comprises a plurality of gate trenches, and
the buffer trench is provided for each gate trench.

5. The semiconductor device according to claim 1, wherein
the gate trench comprises a plurality of gate trenches, and the buffer trench is provided for every two or more gate trenches.

6. The semiconductor device according to claim 1, wherein an end of the buffer trench faces an end of the gate trench in the length direction of the gate trench, and each of the ends of the gate trench and the buffer trench has a rounded corner.

\* \* \* \* \*